(12) United States Patent
Mori

(10) Patent No.: US 11,696,408 B2
(45) Date of Patent: Jul. 4, 2023

(54) CIRCUIT BOARD

(71) Applicant: SHINKO ELECTRIC INDUSTRIES CO., LTD., Nagano (JP)

(72) Inventor: Kenichi Mori, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 71 days.

(21) Appl. No.: 17/450,176

(22) Filed: Oct. 7, 2021

(65) Prior Publication Data

US 2022/0132671 A1   Apr. 28, 2022

(30) Foreign Application Priority Data

Oct. 22, 2020   (JP) ................................. 2020-177159

(51) Int. Cl.
| | |
|---|---|
| *H05K 1/02* | (2006.01) |
| *H05K 5/00* | (2006.01) |
| *H05K 1/18* | (2006.01) |
| *H05K 3/28* | (2006.01) |

(52) U.S. Cl.
CPC ............. *H05K 1/181* (2013.01); *H05K 3/285* (2013.01); *H05K 2201/0989* (2013.01)

(58) Field of Classification Search
CPC ....... H05K 5/0056; H05K 2201/09036; H05K 2201/09827; H05K 2201/0989
See application file for complete search history.

(56) References Cited

U.S. PATENT DOCUMENTS

| | | | |
|---|---|---|---|
| 2018/0076228 A1* | 3/2018 | Wang | H01L 21/77 |
| 2018/0143499 A1* | 5/2018 | Lim | H10K 59/35 |
| 2019/0280075 A1* | 9/2019 | Chung | H10K 50/805 |
| 2020/0103689 A1* | 4/2020 | Hu | G02F 1/13394 |
| 2020/0183233 A1* | 6/2020 | Huang | G02F 1/133608 |
| 2021/0140599 A1 | 5/2021 | Stange | |
| 2021/0151715 A1* | 5/2021 | Lee | H10K 71/00 |

FOREIGN PATENT DOCUMENTS

| | | |
|---|---|---|
| DE | 102017209065 | 12/2018 |
| EP | 2916631 | 9/2015 |
| JP | 2019-121746 | 7/2019 |

OTHER PUBLICATIONS

Extended European Search Report dated Apr. 4, 2022 issued with respect to the corresponding European Patent Application No. 21202287.5.

* cited by examiner

*Primary Examiner* — Hoa C Nguyen
(74) *Attorney, Agent, or Firm* — IPUSA, PLLC

(57) ABSTRACT

A circuit board includes a substrate having an end surface, and a principal surface on which an electronic component is mounted, a first region, provided on the principal surface, and coated with a moistureproof agent, a second region, provided on the principal surface, and prohibited from being coated with the moistureproof agent, and a groove having two ends, formed in the principal surface, between the first region and the second region. The two ends of the groove reach the end surface of the substrate. The groove includes a guiding part, configured to guide the moistureproof agent overflowing from the first region into the groove, provided at a portion of the groove farthest away from the end surface.

7 Claims, 9 Drawing Sheets

CIRCUIT BOARD

CROSS-REFERENCE TO RELATED APPLICATIONS

This application is based upon and claims priority to Japanese Patent Application No. 2020-177159, filed on Oct. 22, 2020, the entire contents of which are incorporated herein by reference.

FIELD

Certain aspects of the embodiments discussed herein are related to circuit boards.

BACKGROUND

As an example, Japanese Laid-Open Patent Publication No. 2019-121746 proposes a circuit board having a groove formed in a periphery of a bis hole, in order to avoid a moistureproof agent from being coated to the bis hole. The moistureproof agent may sometimes also be referred to as a moisture barrier agent, a moisture resistant agent, a sealing agent, or the like.

However, even in the conventional circuit board having such a groove, the moistureproof agent may spread into a coating prohibited region, such as the bis hole or the like. The coating prohibited region may sometimes also be referred to as a protecting region.

SUMMARY

Accordingly, it is an object in one aspect of the embodiments to provide a circuit board which can reduce spreading of the moistureproof agent into the coating prohibited region.

According to one aspect of the embodiments, a circuit board includes a substrate having an end surface, and a principal surface on which an electronic component is mounted; a first region, provided on the principal surface, and coated with a moistureproof agent; a second region, provided on the principal surface, and prohibited from being coated with the moistureproof agent; and a groove having two ends, formed in the principal surface, between the first region and the second region, wherein the two ends of the groove reach the end surface of the substrate, and wherein the groove includes a guiding part, configured to guide the moistureproof agent overflowing from the first region into the groove, provided at a portion of the groove farthest away from the end surface.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
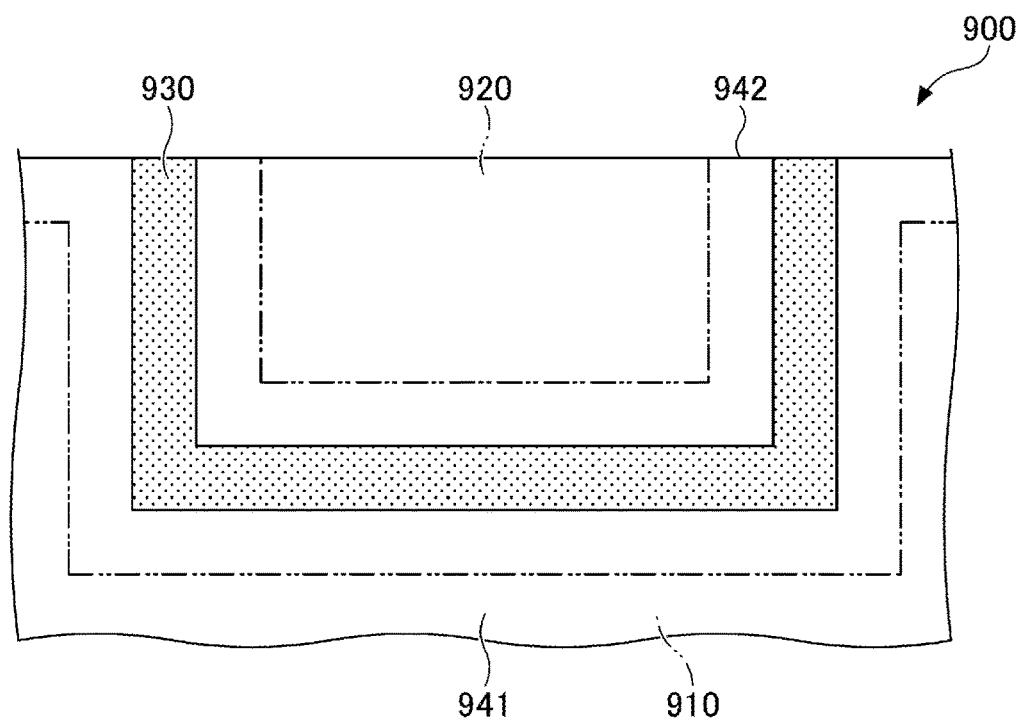
FIG. 1A and FIG. 1B are diagrams illustrating a configuration of a circuit board according to one example, and a flow of a moistureproof agent therein.

Preferred embodiments of the present invention will be described with reference to the accompanying drawings. In the drawings, those parts that are the same are designated by the same reference numerals, and a repeated description of the same parts may be omitted.

A description will now be given of a circuit board according to each embodiment of the present invention.

The present inventor made diligent studies to investigate the mechanism by which a moistureproof agent flows into a coating prohibited region of the conventional circuit board. As a result, the present inventor found that the moistureproof agent which flows into a groove of the circuit board may flow and leak outside the groove.

Figure 1B:
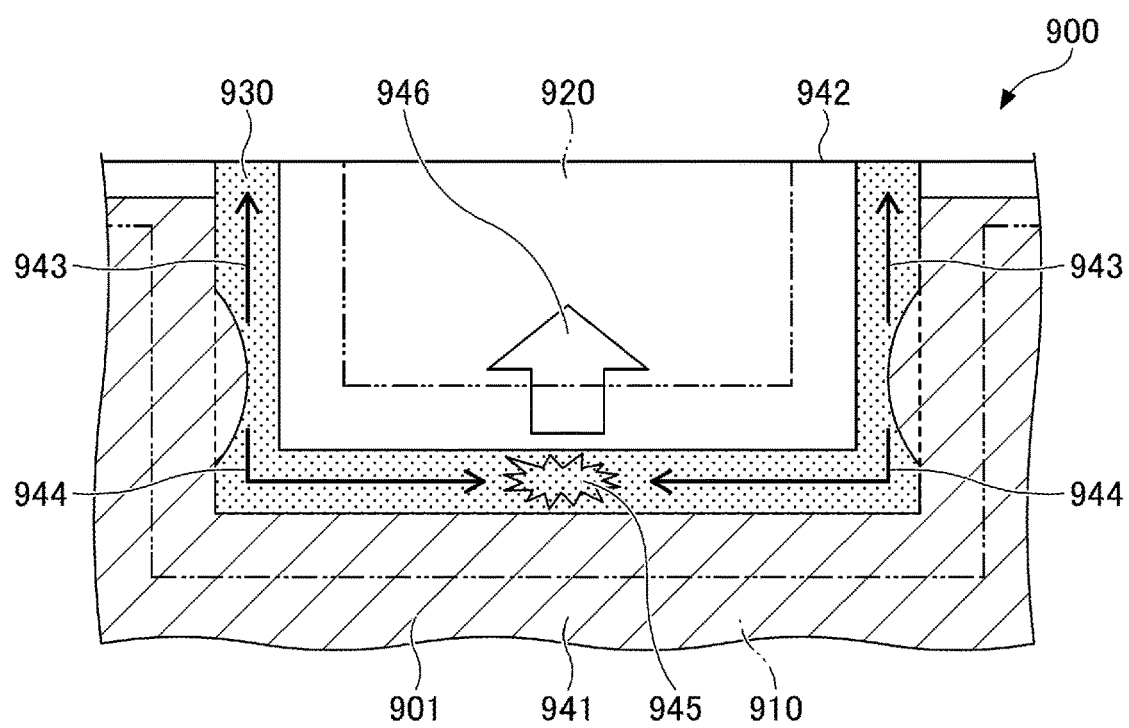

FIG. 1A and FIG. 1B are diagrams illustrating a configuration of the circuit board according to one example, and the flow of the moistureproof agent therein. FIG. 1A illustrates the configuration of the circuit board according to this example, and FIG. 1B illustrates the flow of the moistureproof agent in the circuit board according to this example.

As illustrated in FIG. 1A, a circuit board 900 according to this example includes a substrate having a principal surface 941. A coated region 910 where a moistureproof agent is coated, and a coating prohibited region 920 where the coating of the moistureproof agent is prohibited, are provided on the principal surface 941 of the substrate. In addition, a groove 930 is formed between the coated region 910 and the coating prohibited region 920 on the principal surface 941. The groove 930 is formed so as to surround the coating prohibited region 920 in a plan view, and both ends of the groove 930 reach an end surface 942 of the substrate. The coated region 910 is provided with a mounting region where an electronic component is mounted.

As illustrated in FIG. 1B, after the electronic component is mounted on the mounting region, a moistureproof agent 901 is coated onto the coated region 910. If the moistureproof agent 901 is coated excessively, the moistureproof agent 901 overflows from the coated region 910. The moistureproof agent 901, which overflows, reaches the groove 930 and spreads along edges of the groove 930. Thereafter, the moistureproof agent 901 flows into the groove 930 from a location where a pressure causing a flow of the moistureproof agent 901 is high.

Accordingly, as illustrated in FIG. 1B, if the pressure causing the flow of the moistureproof agent 901 becomes high at two locations sandwiching the coating prohibited region 920 along a direction parallel to the end surface 942, the moistureproof agent 901 flows into the groove 930 from the two locations sandwiching the coating prohibited region 920. A part of the moistureproof agent 901 flowing into the groove 930 flows toward the end surface 942, as indicated by arrows 943, and is discharged to the outside from the end surface 942. On the other hand, the other, remaining part of the moistureproof agent 901 flowing into the groove 930 flows in a direction opposite to the end surface 942, as indicated by arrows 944, thereby creating a collision 945 of the moistureproof agent 901 flowing in opposite directions, at a position separated from the end surface 942. As a result, the moistureproof agent 901 overflows from the groove 930, and spreads into the coating prohibited region 920 as indicated by a thick arrow 946.

As a result of the diligent studies conducted by the present inventor, it was found that the moistureproof agent 901 overflows from the groove 930, and flows into the coating prohibited region 920, according to the mechanism described above.

Hereinafter, embodiments will be described in detail with reference to the accompanying drawings. In this specification and the drawings, constituent elements having substantially the same functions or configurations are designated by the same reference numerals, and a repeated description of the same constituent elements will be omitted.

First Embodiment

Figure 2:
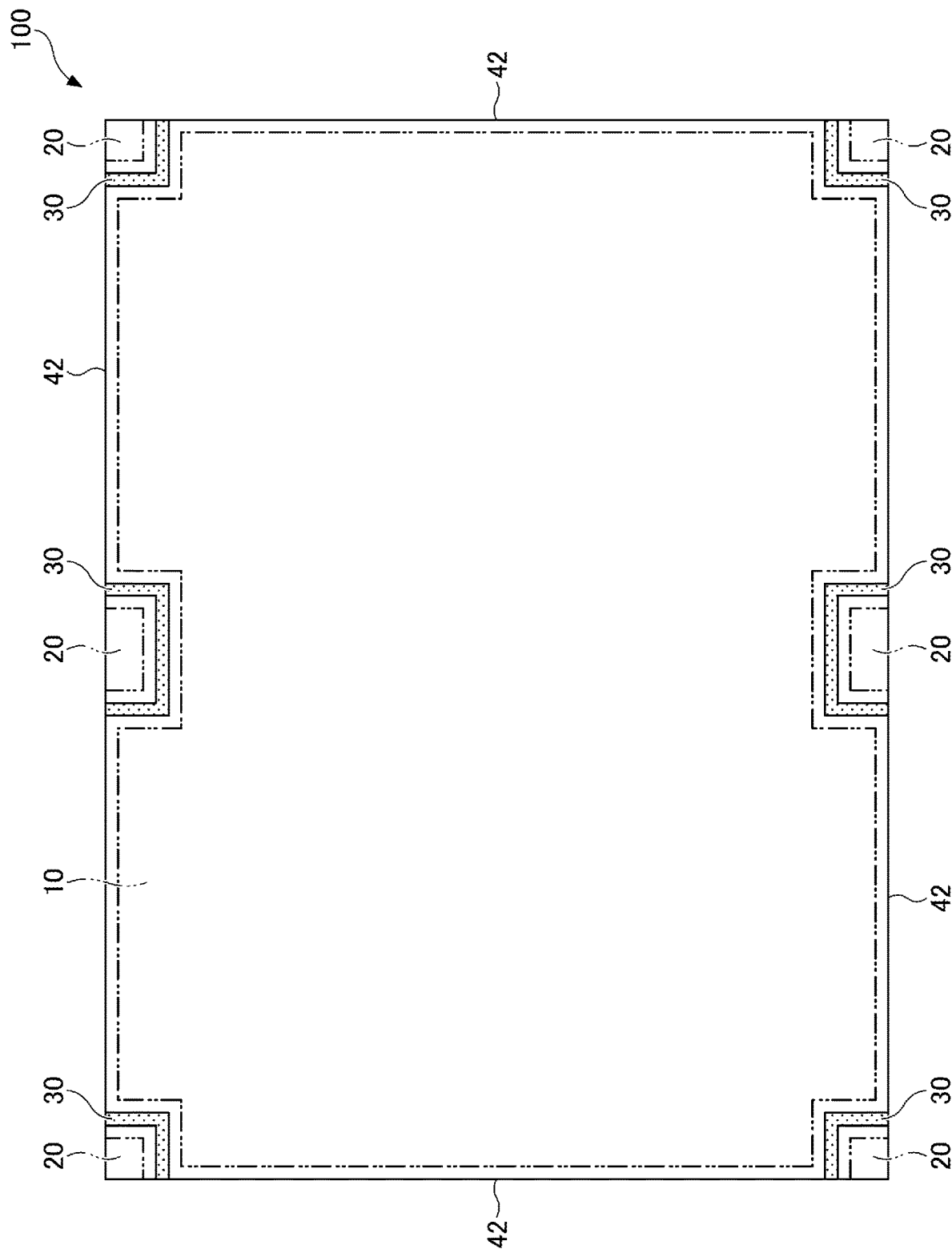
FIG. 2 is a top view illustrating a circuit board according to a first embodiment.
Figure 3:
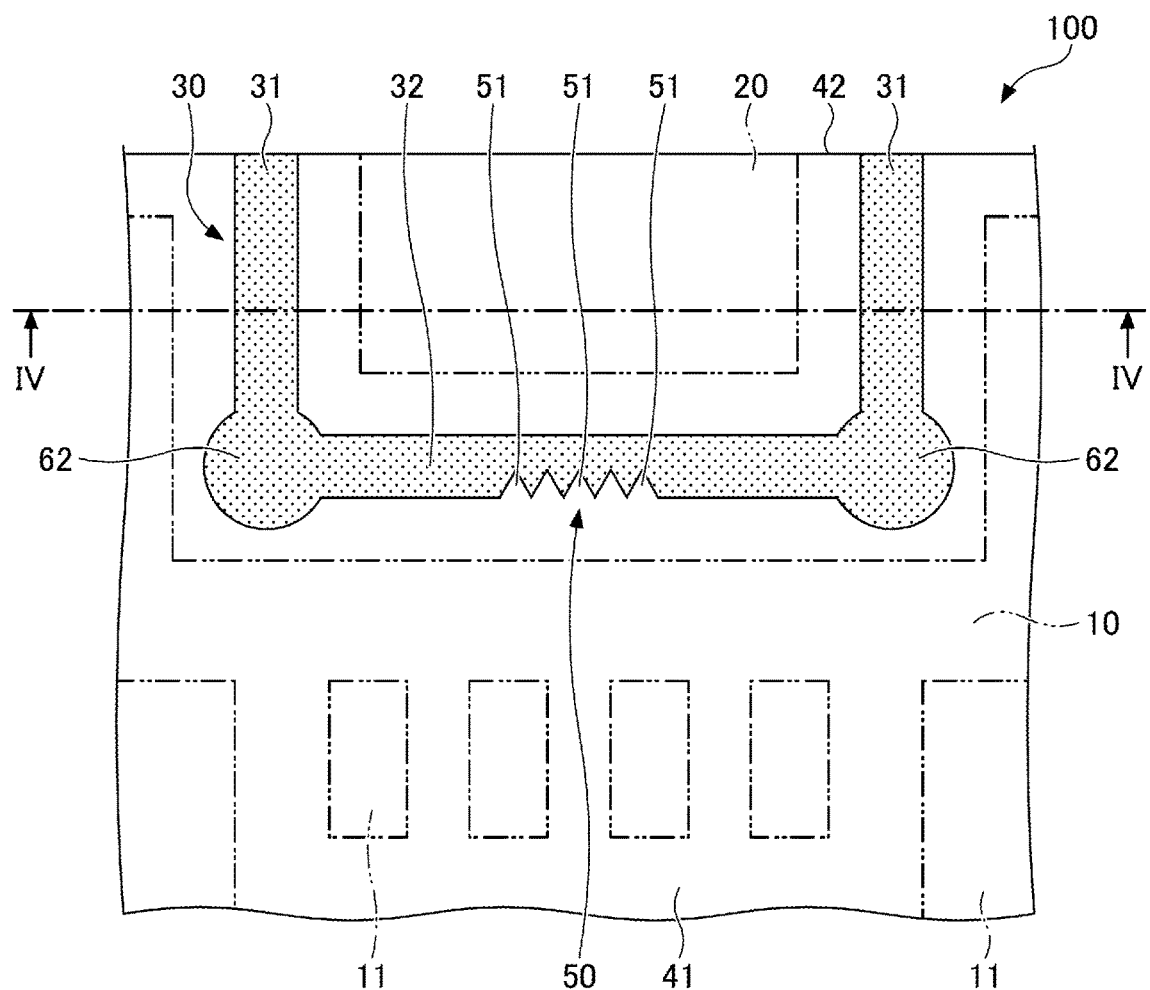
FIG. 3 is a top view illustrating a configuration of a groove of the circuit board according to the first embodiment.
Figure 4:
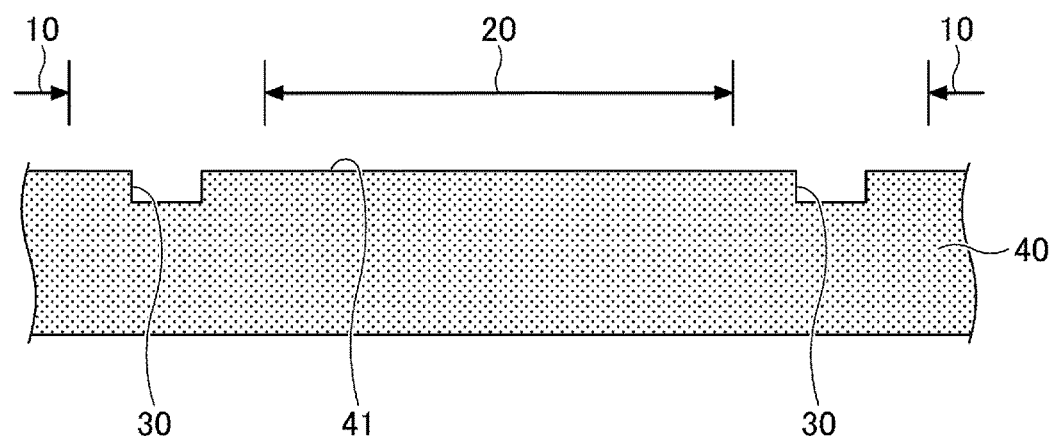
FIG. 4 is a cross sectional view illustrating the configuration of the groove of the circuit board according to the first embodiment.

First, a first embodiment will be described. The first embodiment relates to a circuit board. FIG. 2 is a top view illustrating the circuit board according to the first embodiment. FIG. 3 is a top view illustrating a configuration of a groove of the circuit board according to the first embodiment. FIG. 4 is a cross sectional view illustrating the configuration of the groove of the circuit board according to the first embodiment. FIG. 3 illustrates a part of the circuit board according to the first embodiment on an enlarged scale. In addition, FIG. 4 corresponds to a cross sectional view along a line IV-IV in FIG. 3.

As illustrated in FIG. 2A through FIG. 4, a circuit board 100 according to the first embodiment includes a substrate 40 on which an electronic component is mounted. For example, various circuit patterns may be formed on the substrate 40. The electronic component is mounted on a principal surface 41 of the substrate 40. A coated region 10 which is coated with a moistureproof agent, and a coating prohibited region 20 prohibited of being coated with the moistureproof agent, are provided on the principal surface 41 of the substrate 40. The coating prohibited region 20 is a region provided with a bis hole, or a region provided with a wire bonding pad, for example. In addition, a groove 30 is formed in the principal surface 41, between the coated region 10 and the coating prohibited region 20. A mounting region 11 where the electronic component is mounted, is provided in the coated region 10. For example, a plurality of mounting regions 11 may be provided in the coated region 10. The coated region 10 is an example of a first region (or first area), and the coating prohibited region 20 is an example of a second region (or second area).

The groove 30 has two first parts 31 extending from an end surface 42 of the substrate 40, and a second part 32 which connects the two first parts 31. In other words, both ends of the groove 30 reach the end surface 42 of the substrate 40. For example, the first parts 31 extend in a direction perpendicular to the end surface 42, and the second part 32 extends in a direction parallel to the end surface 42. In addition, the groove 30 is famed to surround the coating prohibited region 20 in a plan view. The plan view corresponds to the top view illustrated in FIG. 3, for example.

Multiple protrusions 51 are famed on a farthest portion of the second part 32, farthest away from the end surface 42. The protrusions 51 are formed on a sidewall surface of the groove 30 closer to the coated region 10 in the plan view, and protrude in a direction inward of the groove 30. In the plan view, the protrusions 51 may have a planar shape such that a width of each protrusion 51 narrows toward a tip end thereof, for example. For example, in the plan view, an angle of the tip end of the protrusion 51 may be less than 180 degrees, preferably 90 degrees or less, and more preferably 60 degrees or less. The protrusions 51 are included in a guiding part 50. As will be described later, the guiding part 50 guides the moistureproof agent which overflows from the coated region into the groove 30. The direction inward of the groove refers to a direction toward the coating prohibited region 20 when viewed from the groove 30. In addition, the farthest portion refers to a region including a portion farthest away from the end surface 42 of the second part 32 along a direction in which the groove 30 extends.

A storage part 62, having a generally circular shape in the plan view, for example, is formed at a connecting portion connecting one of the two first parts 31 to the second part 32, and at a connecting portion connecting the other of the two first parts 31 to the second part 32. As will be described later, the storage part 62 stores the moistureproof agent flowing from the guiding part 50 toward each of the first parts 31. The storage part 62 is an example of a second storage part. The storage part 62 refers to a wide region of the groove in the plan view, and the planar shape of the storage part 62 may be a generally circular shape or a generally rectangular shape, for example. The pressure of the moistureproof agent is temporarily reduced at a point in time when the moistureproof agent flowing through the groove 30 flows into the storage part 62, and the moistureproof agent remains inside the groove 30. It is thus possible to reduce the possibility of the moistureproof agent overflowing from the groove 30. Because the pressure of the moistureproof agent is likely to increase near the guiding part 50 and at a corner portion of the groove 30, the storage part 62 is particularly effective at such locations.

The flow of the moistureproof agent, that is, a manner in which the moistureproof agent flows, in the circuit board 100 according to the first embodiment will be described. FIG. 5A, FIG. 5B, FIG. 6A, and FIG. 6B are diagrams for explaining the flow of the moistureproof agent of the circuit board according to the first embodiment.

Figure 5A:
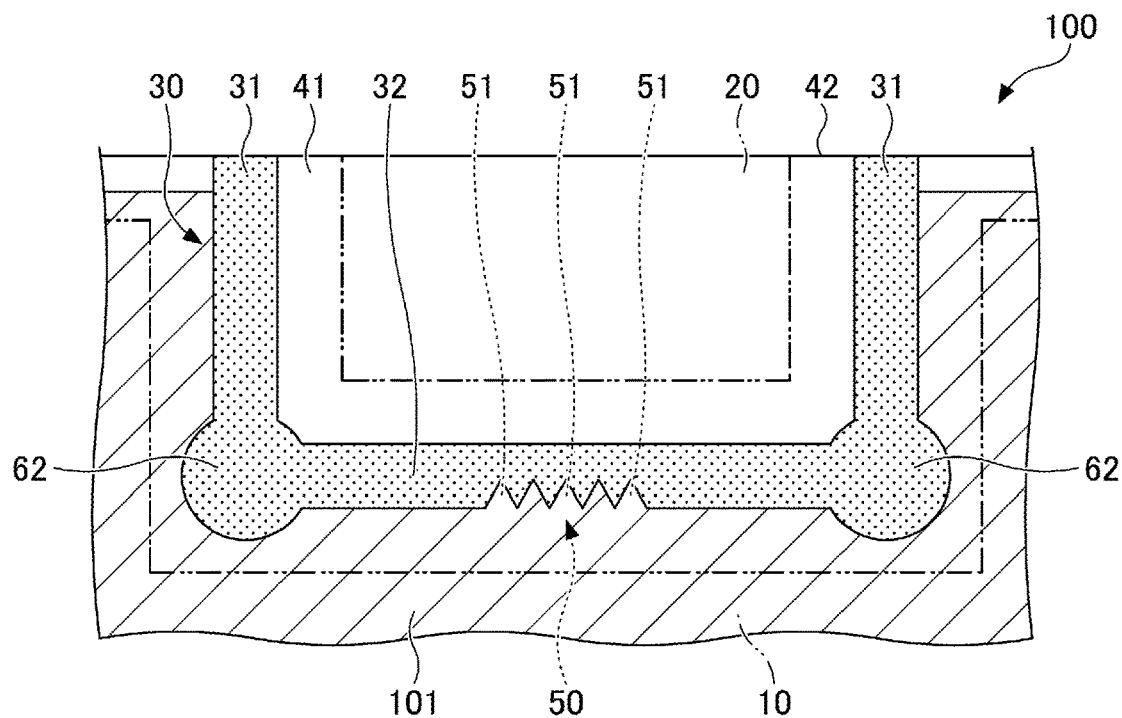
FIG. 5A and FIG. 5B are diagrams for explaining the flow of the moistureproof agent of the circuit board according to the first embodiment.

The circuit board 100 is used in a state where the electronic component is mounted in the mounting region 11. After mounting the electronic component, a moistureproof agent 101 is coated on the coated region 10. If the moistureproof agent 101 is coated excessively, the moistureproof agent 101 overflows from the coated region 10 and spreads on top of the protrusions 51, as illustrated in FIG. 5A.

Figure 5B:
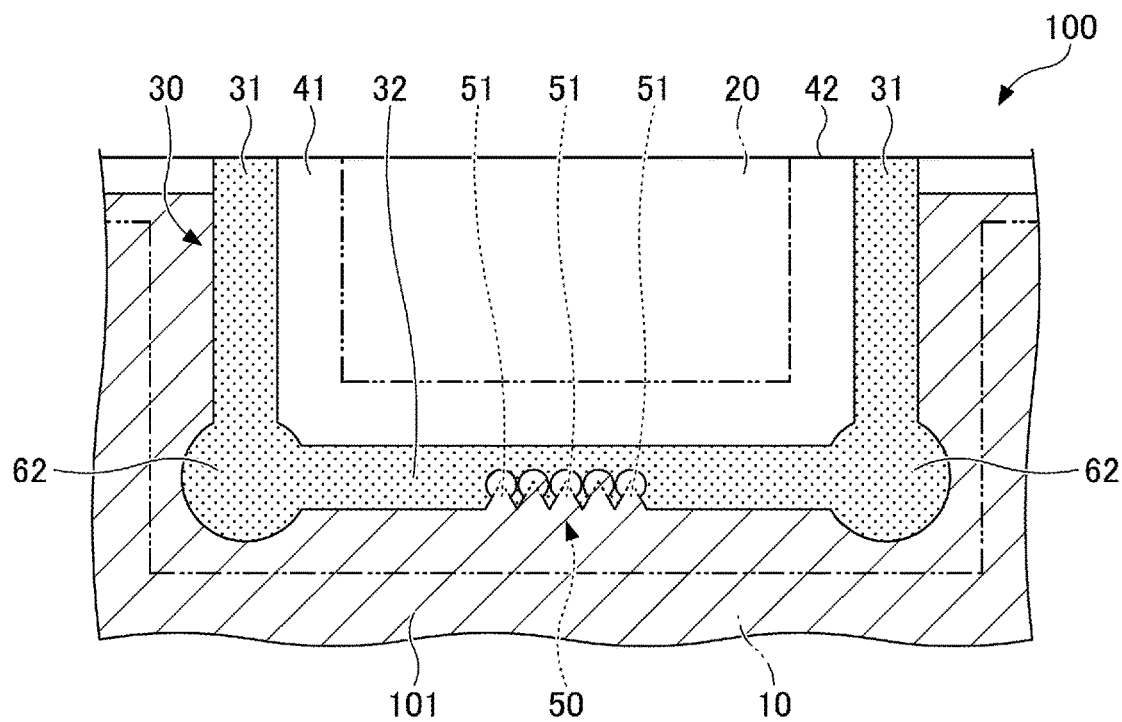

Thereafter, as the amount of the overflowing moistureproof agent 101 increases, the pressure causing the moistureproof agent 101 to flow toward the protrusions 51 becomes higher than at other portions where the first parts 31 connect to the second part 32. For this reason, as illustrated in FIG. 5B, the moistureproof agent 101 spreading on top of the protrusions 51 receives a high pressure at the tip ends of the protrusions 51, and flows from the tip ends of the protrusions 51 into the groove 30.

Figure 6A:
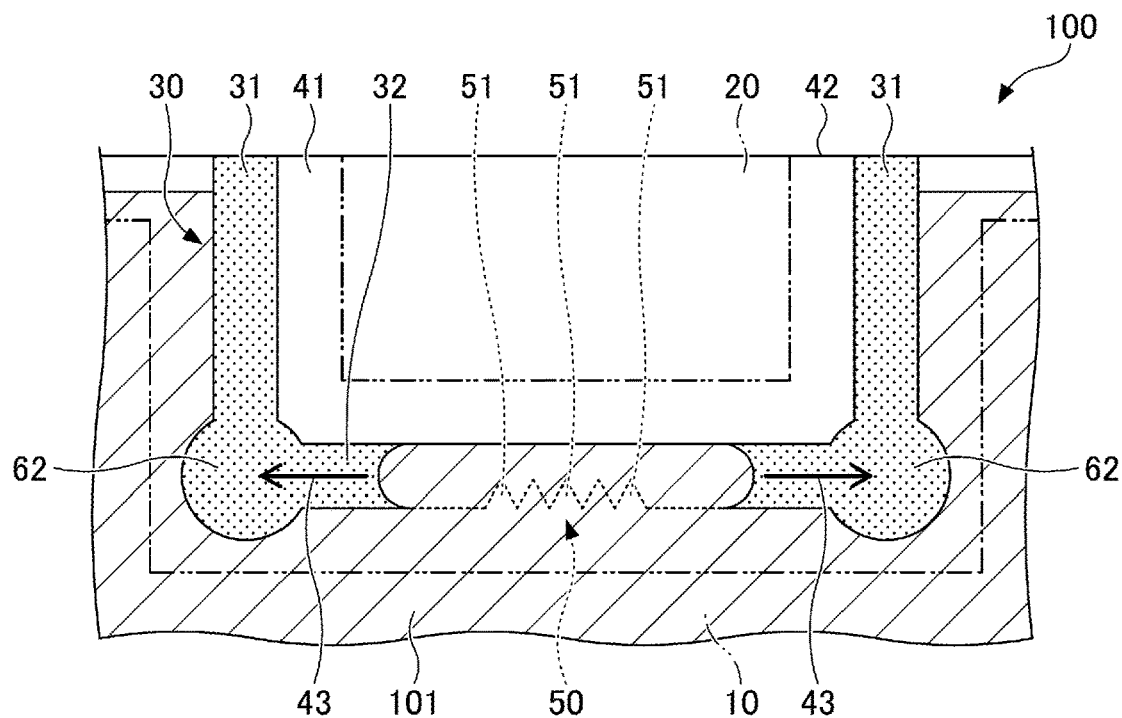
FIG. 6A and FIG. 6B are diagrams for explaining the flow of the moistureproof agent of the circuit board according to the first embodiment.

When the flow of the moistureproof agent 101 from the tip ends of the protrusions 51 into the groove 30 is generated, the moistureproof agent 101 continues to flow preferentially from the tip ends of the protrusions 51 into the groove 30, as illustrated in FIG. 6A, and the moistureproof agent 101 flowing into the groove 30 flows from the second part 32 toward the storage parts 62, as indicated by arrows 43. In other words, the protrusions 51 function as the guiding part 50 which guides the moistureproof agent 101 overflowing from the coated region into the groove 30.

Figure 6B:
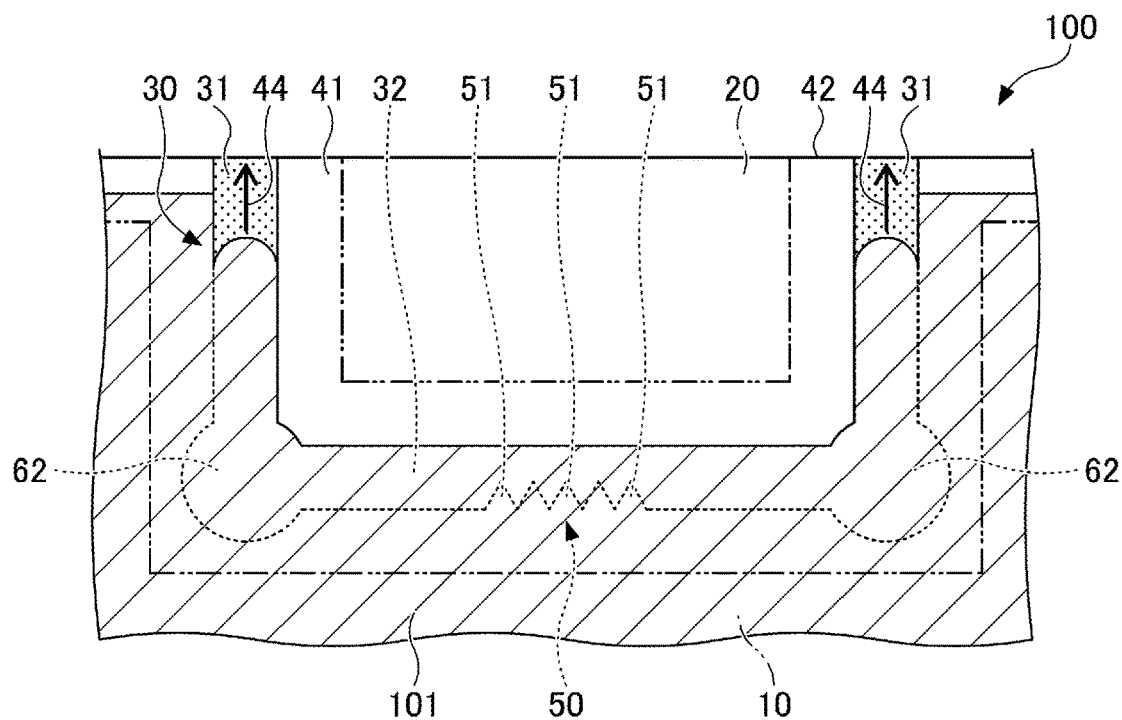

As illustrated in FIG. 6B, the moistureproof agent 101 flowing from the guiding part 50 toward the storage parts 62 is once stored in the storage parts 62, and thereafter flows toward the end surface 42, as indicated by arrows 44. Hence, the moistureproof agent 101 is discharged to the outside from the end surface 42.

As described above, in this embodiment, the protrusions 51, which function as the guiding part 50, are famed at the farthest portion which is farthest away from the end surface 42 of the second part 32 of the groove 30. For this reason, the moistureproof agent 101 overflowing from the first parts 31 flows preferentially from the guiding part 50 into the groove 30. Accordingly, inside the groove 30, the moistureproof agent 101 flows uniformly from the guiding part 50 toward the end surface 42, through the first part 31, and reduces a collision of the moistureproof agent 101 inside the groove 30. For this reason, the overflow of the moistureproof agent 101 from the groove 30 caused by the collision of the moistureproof agent 101 can be reduced, and the moistureproof agent 101 flowing into the groove 30 can be discharged from the end surface 42 without spreading to the coating prohibited region 20. In other words, according to the first embodiment, it is possible to reduce the spreading of the moistureproof agent 101 to the coating prohibited region 20.

Moreover, because the direction in which the first parts 31 extends is perpendicular to the direction in which the second part 32 extends, the moistureproof agent 101 flowing through the second part 32 would abruptly change the direction of flow if the storage parts 62 were not provided. For this reason, if the overflowing amount of the moistureproof agent 101 were particularly large, the pressure of the moistureproof agent 101 would temporarily become high at connecting portions between the second part 32 and the first part 31, and the moistureproof agent 101 may overflow from these connecting portions. But in this embodiment, because the storage parts 62 are provided at these connecting portions, it is possible to reduce the abrupt change in the flowing direction of the moistureproof agent 101, relieve the increase in pressure, and reduce the overflow of the moistureproof agent 101.

Although the tip ends of the protrusion 51 need not be sharp or pointed, a radius of curvature of the tip ends of the protrusions 51 is preferably as small as possible, so as to facilitate the flow of the moistureproof agent 101 into groove 30.

Figure 7:
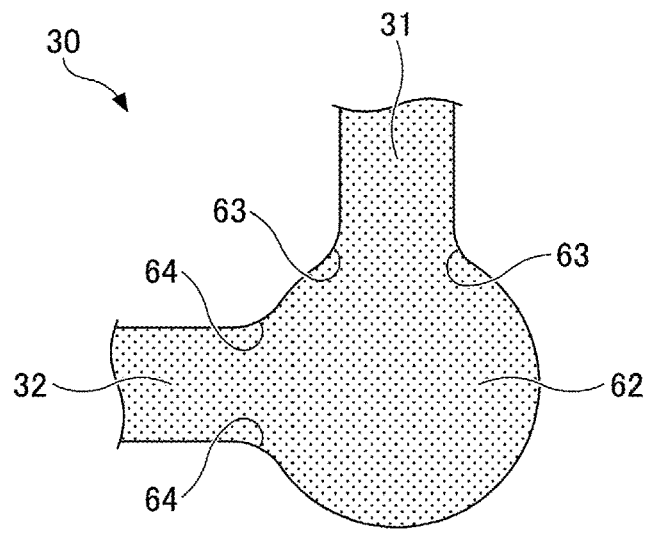
FIG. 7 is a top view illustrating a storage part.

In addition, as illustrated in FIG. 7, the sidewall surface of the groove 30 is preferably a curved surface 64 at a boundary portion between the second part 32 and the storage part 62, in order to reduce concentration of the pressure of the moistureproof agent 101 on the sidewall surface of the groove 30 when the moistureproof agent 101 flows from the second part 32 to the storage parts 62. Similarly, the sidewall surface of the groove 30 is preferably curved 63 at a boundary portion between the storage part 62 and each of the two first parts 31, in order to reduce concentration of the pressure of the moistureproof agent 101 on the sidewall surface of the groove 30 when the moistureproof agent 101 flows from the storage part 62 to each of the two first parts 31. FIG. 7 is a top view illustrating a preferred configuration near the storage part 62.

Second Embodiment

Figure 8:
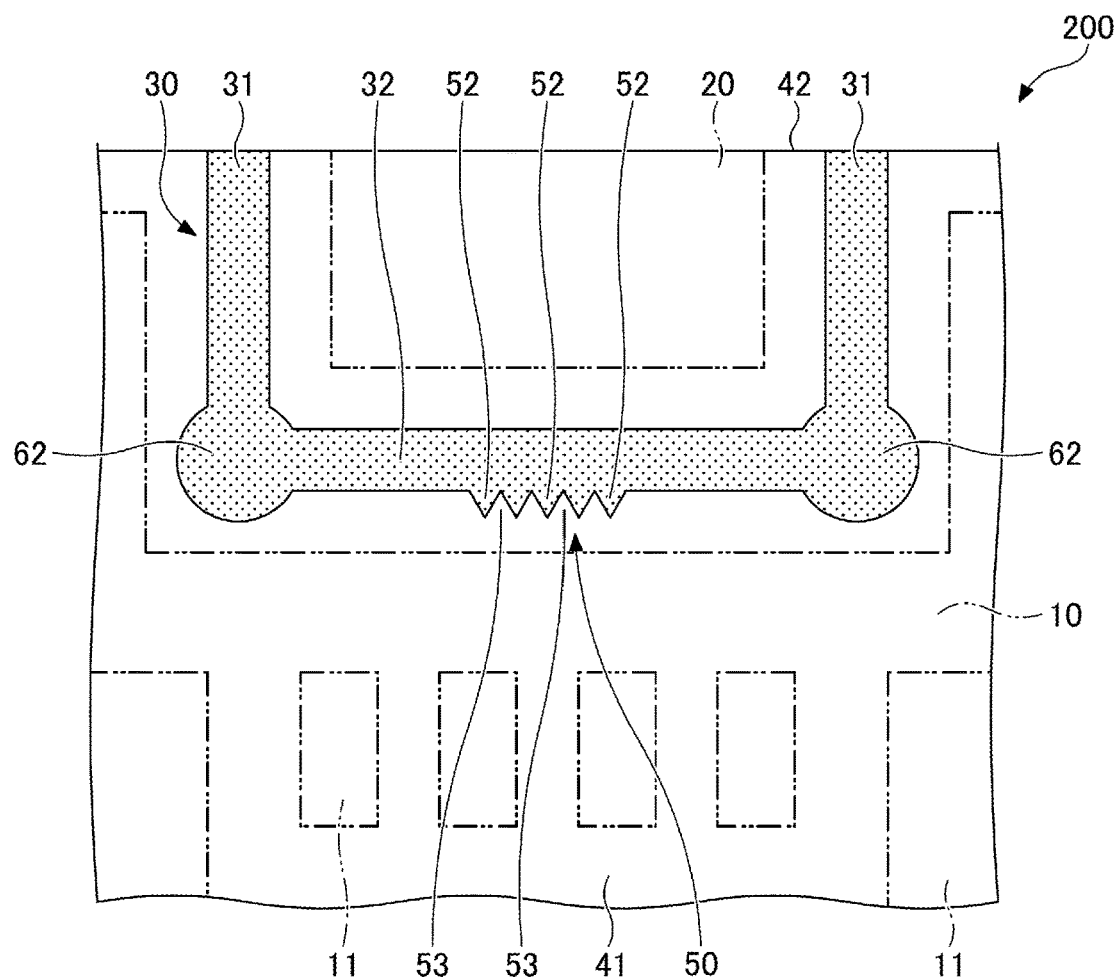
FIG. 8 is a top view illustrating the configuration of the groove of the circuit board according to a second embodiment.

Next, a second embodiment will be described. The second embodiment differs from the first embodiment in that the configuration of the guiding part 50 is different from that of the first embodiment. FIG. 8 is a top view illustrating the configuration of the groove in the circuit board according to the second embodiment.

As illustrated in FIG. 8, in a circuit board 200 according to the second embodiment, multiple recesses 52 are formed in a farthest portion of the second part 32, farthest away from the end surface 42, in place of the multiple protrusions 51 provided in the first embodiment. The recesses 52 are formed in the sidewall surface of the groove 30 closer to the coated region 10 in the plan view, and cave in in a direction outward of the groove 30. A protrusion 53 is formed between two mutually adjacent recesses 52, and multiple protrusions 53 are provided. In the plan view, the protrusions 53 may have a planar shape such that a width of each protrusion 53 narrows toward a tip end thereof, for example. For example, in the plan view, an angle of the tip end of the protrusion 53 may be less than 180 degrees, preferably 90 degrees or less, and more preferably 60 degrees or less. The recesses 52 and the protrusions 53 are included in the guiding part 50. The direction outward of the groove 30 refers to a direction toward the coated region 10 when viewed from the groove 30.

The configuration of other parts may be similar to those of the first embodiment.

According to the second embodiment, if the moistureproof agent 101 is coated excessively, the moistureproof agent 101 overflowing from the coated region preferentially flows from the guiding part 50 into the groove 30. For this reason, similar to the first embodiment, it is possible to reduce the spreading of the moistureproof agent 101 to the coating prohibited region 20.

Third Embodiment

Figure 9:
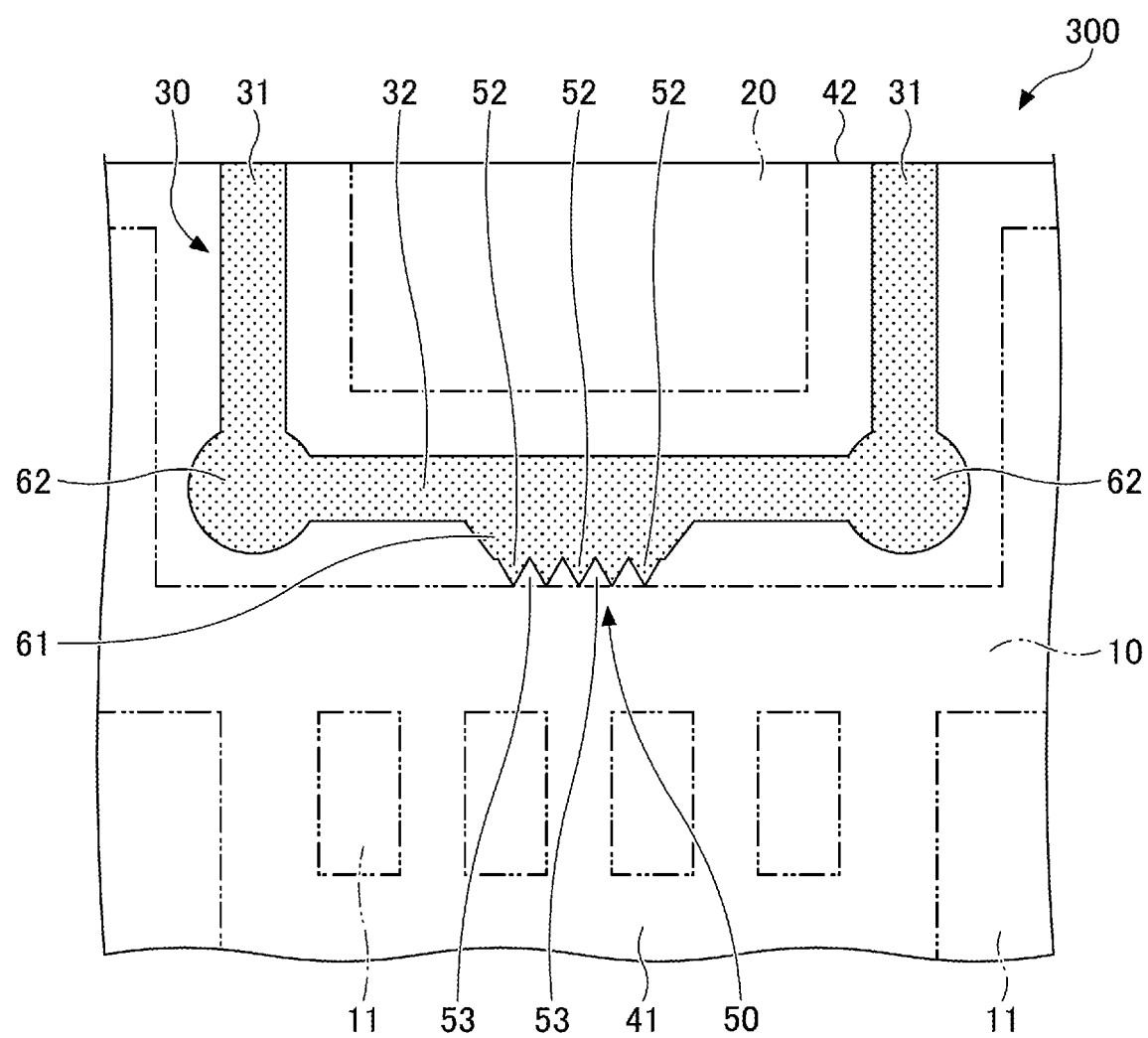
FIG. 9 is a top view illustrating the configuration of the groove of the circuit board according to a third embodiment.

Next, a third embodiment will be described. The third embodiment differs from the second embodiment in that the configuration of the guiding part 50 is different from that of the second embodiment. FIG. 9 is a top view illustrating the configuration of the groove in the circuit board according to the third embodiment.

As illustrated in FIG. 9, in a circuit board 300 according to the third embodiment, a storage part 61, connected to the multiple recesses 52, is formed in the guiding part 50. The storage part 61 can store the moistureproof agent 101. The storage part 61 is an example of a first storage part.

The configuration of other parts may be similar to those of the second embodiment.

According to the third embodiment, if the moistureproof agent 101 is coated excessively, the moistureproof agent 101 overflowing from the coated region preferentially flows from the guiding part 50 into the groove 30. For this reason, similar to the first embodiment, it is possible to reduce the spreading of the moistureproof agent 101 to the coating prohibited region 20.

In addition, the moistureproof agent 101 flowing into the groove 30 is temporarily stored in the storage part 61, and thereafter flows toward the storage parts 62 through the second part 32. For this reason, the force of the moistureproof agent 101 flowing into the groove 30 is weakened, so as to reduce a sudden increase in the pressure of the moistureproof agent 101 in the second part 32. Accordingly, the moistureproof agent 101 can easily flow more stably in the groove 30.

According to the third embodiment, when compared to the other embodiments, the guiding part 50 is closer to the coated region 10, and thus, the moistureproof agent 101 can more easily be guided into the groove 30. In this case, the guiding part 50 may make contact with the coated region 10, as illustrated in FIG. 9.

Fourth Embodiment

Figure 10:
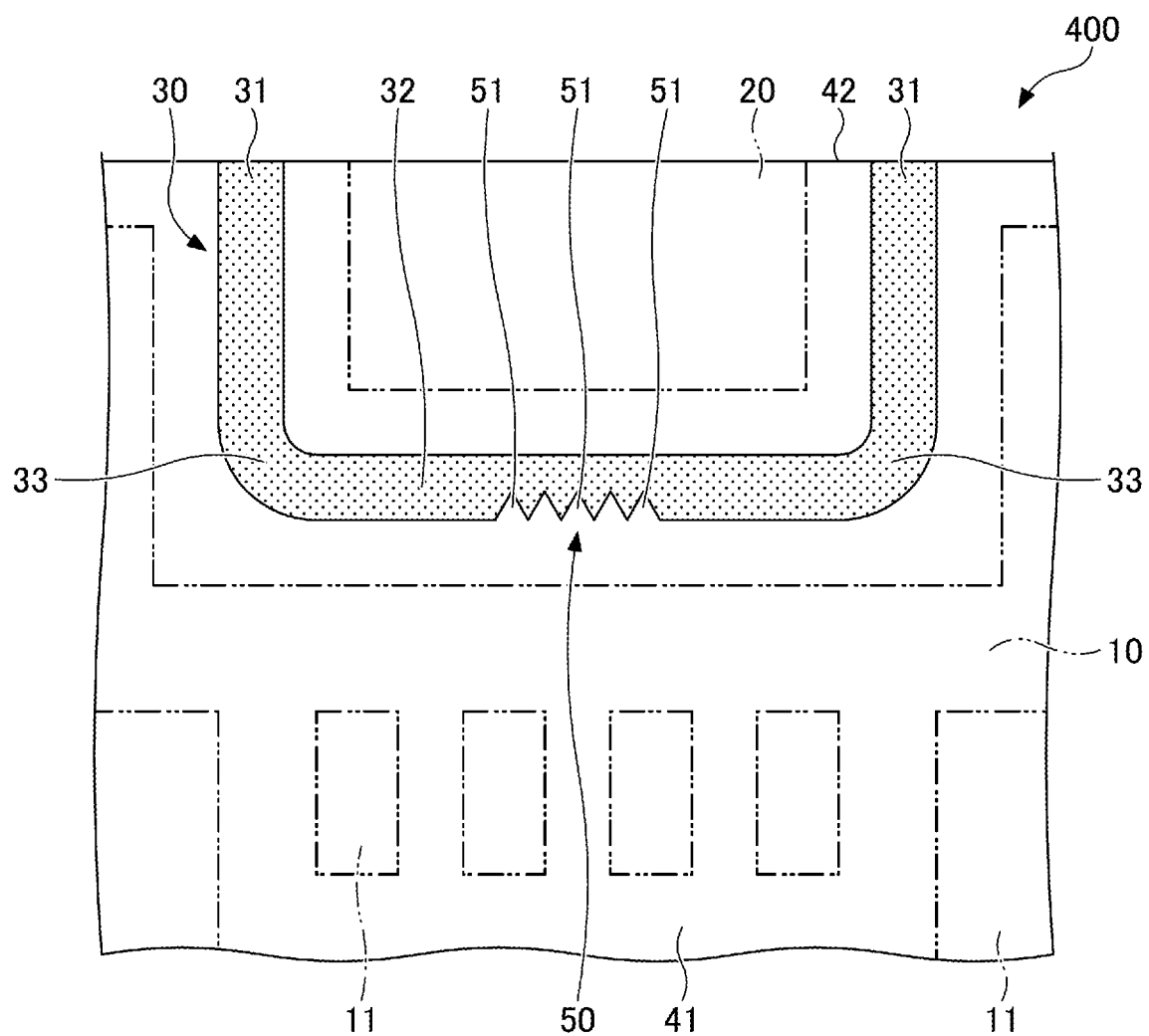
FIG. 10 is a top view illustrating the configuration of the groove of the circuit board according to a fourth embodiment.

Next, a fourth embodiment will be described. The fourth embodiment differs from the first embodiment in that the configuration of the connecting portion between the first part and the second part is different from that of the first embodiment. FIG. 10 is a top view illustrating the configuration of the groove in the circuit board according to the fourth embodiment.

As illustrated in FIG. 10, in a circuit board 400 according to the fourth embodiment, the storage part 62 is not provided, but instead, a curved connecting portion 33 is provided at the connecting portion between the second part 32 and each of the two first parts 31. In the plan view, each curved connecting portion 33 is curved in one direction. In the plan view of the curved connecting portion 33, the sidewall surface of the groove 30 is curved in one direction. In other words, between the second part 32 and each of the two first parts 31, the sidewall surface of the groove 30 in the plan view is a curved surface which curves in one direction.

The configuration of other parts may be similar to those of the first embodiment.

According to the fourth embodiment, if the moistureproof agent 101 is coated excessively, the moistureproof agent 101 overflowing from the coated region preferentially flows from the guiding part 50 into the groove 30. For this reason, similar to the first embodiment, it is possible to reduce the spreading of the moistureproof agent 101 to the coating prohibited region 20.

Further, although the storage part 62 is not provided, the curved connecting portions 33 are provided, thereby making it possible to reduce concentration of the pressure of the moistureproof agent 101 on the sidewall surface of the groove 30.

The storage part 61 according to the third embodiment may be provided in the first embodiment, and the curved connecting portion 33 according to the fourth embodiment may be provided in the second and third embodiments.

Figure 11:
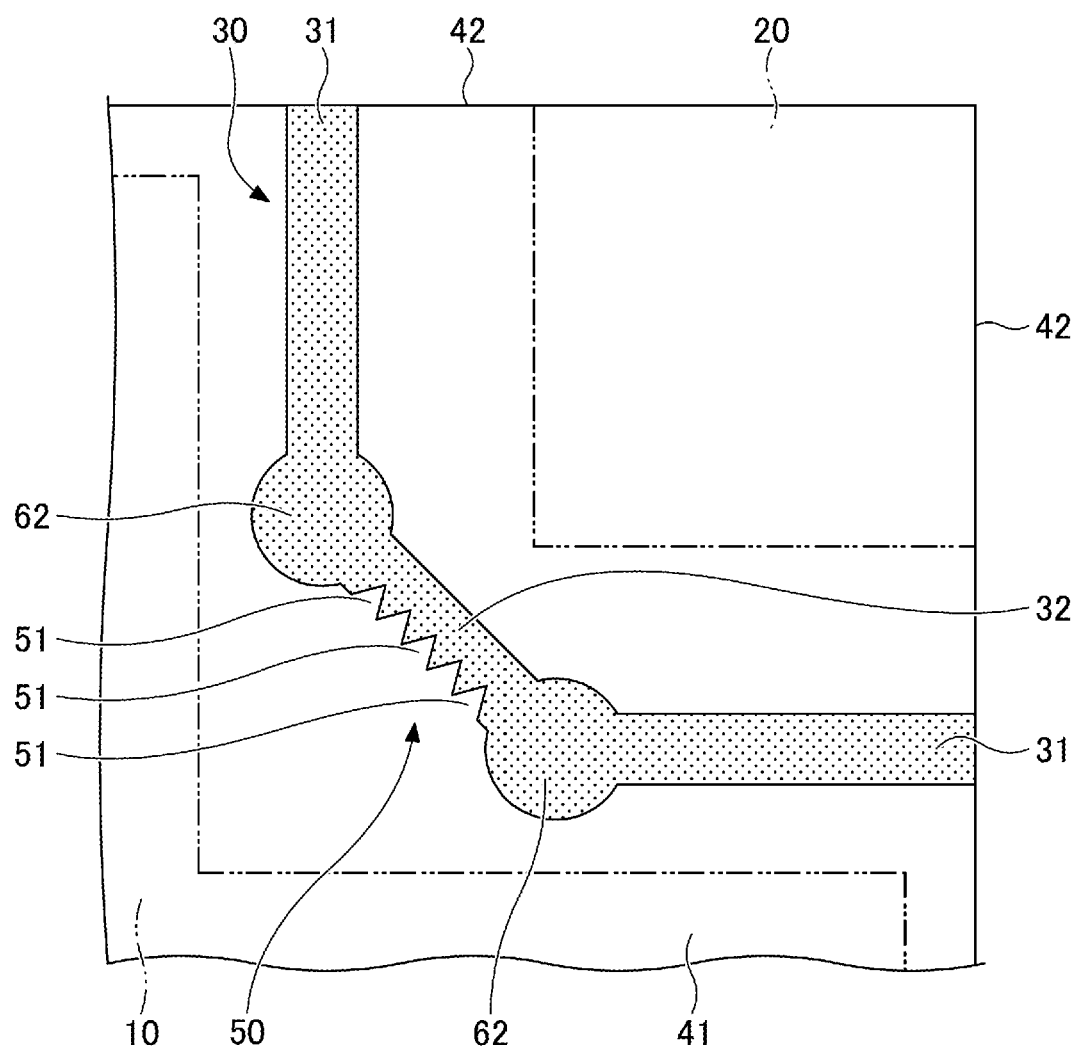
FIG. 11 is a top view illustrating an example of a guiding part applied to the groove provided at a corner portion of a substrate.

Further, the guiding part 50 according to the first through fourth embodiments may be applied to the coating prohibited region 20 provided at a corner portion of the substrate 40. FIG. 11 is a top view illustrating an example of the guiding part 50 applied to the groove 30 provided at the corner portion of the substrate 40.

In the example illustrated in FIG. 11, two adjacent end surfaces 42 are perpendicular to each other. One of the two first parts 31 is provided on the principal surface 41 to reach one of the two end surfaces 42, and the other of the two first parts 31 is provided on the principal surface 41 to reach the other of the two end surfaces 42. The second part 32 is provided on the principal surface 41 so as to connect the two first parts 31. Similar to the first embodiment, the multiple protrusions 51 are formed as an example of the guiding part 50, at a farthest portion of the second part 32, farthest away from each of the two end surfaces 42. The groove 30, which includes the two first parts 31 and the second part 32, is formed so as to surround the coating prohibited region 20 provided at the corner portion of the substrate 40.

Hence, the guiding part 50 is preferably famed in the groove 30 which is provided at the corner portion of the substrate 40. The guiding part 50 can also reduce the spreading of the moistureproof agent 101 to the coating prohibited region 20.

Accordingly to each of the embodiments described above, it is possible to provide a circuit board which can reduce spreading of the moistureproof agent into the coating prohibited region.

Although the embodiments are numbered with, for example, "first," "second," "third," or "fourth," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A circuit board comprising:
   a substrate having an end surface, and a principal surface on which an electronic component is mounted;
   a first region, provided on the principal surface, and coated with a moistureproof agent;
   a second region, provided on the principal surface, and prohibited from being coated with the moistureproof agent; and
   a groove having two ends, formed in the principal surface, between the first region and the second region, wherein
   the two ends of the groove reach the end surface of the substrate,
   the groove includes a guiding part, configured to guide the moistureproof agent overflowing from the first region into the groove, provided at a portion of the groove farthest away from the end surface, and
   the guiding part, in a plan view, includes multiple protrusions formed on a sidewall surface of the groove closer to the first region and protruding in a direction inward of the groove.

2. The circuit board as claimed in claim 1, wherein the guiding part includes a first storage part configured to store the moistureproof agent guided into the groove.

3. The circuit board as claimed in claim 1, wherein the groove further includes
   two first parts extending from the end surface of the substrate, and
   a second part, including the guiding part, and connecting the two first parts,
   and the circuit board further comprising:
   a second storage part, provided at a connecting portion connecting the second part and each of the two first parts, and configured to store the moistureproof agent flowing from the guiding part toward each of the two first parts.

4. The circuit board as claimed in claim 3, wherein the sidewall surface of the groove is curved at a boundary portion between the second storage part and each of the two first parts, and at a boundary portion between the second part and the second storage part.

5. The circuit board as claimed in claim 1, wherein the groove further includes
- two first parts extending from the end surface of the substrate, and
- a second part, including the guiding part, and connecting the two first parts,
- wherein the sidewall surface of the groove between the second part and each of the two first parts is a curved surface curved in one direction in the plan view.

6. The circuit board as claimed in claim 1, wherein the two ends of the groove reach the same end surface of the substrate.

7. The circuit board as claimed in claim 1, wherein the two ends of the groove reach adjacent, mutually perpendicular end surfaces of the substrate, respectively.

\* \* \* \* \*